United States Patent [19]
Schuegraf

[11] Patent Number: 6,071,771
[45] Date of Patent: *Jun. 6, 2000

[54] SEMICONDUCTOR PROCESSING METHOD OF FORMING A CAPACITOR AND CAPACITOR CONSTRUCTIONS

[75] Inventor: Klaus Schuegraf, Boise, Id.

[73] Assignee: Micron Technology, Inc., Boise, Id.

[*] Notice: This patent is subject to a terminal disclaimer.

[21] Appl. No.: 09/122,473

[22] Filed: Jul. 23, 1998

Related U.S. Application Data

[63] Continuation of application No. 08/542,430, Oct. 12, 1995, Pat. No. 5,786,248.

[51] Int. Cl.[7] .............................................. H01L 21/8242

[52] U.S. Cl. .......................... 438/240; 438/250; 438/253; 438/393

[58] Field of Search ................................... 438/238, 240, 438/250, 393, 253

[56] References Cited

U.S. PATENT DOCUMENTS

| | | | |
|---|---|---|---|
| 4,464,701 | 8/1984 | Roberts et al. | 361/313 |
| 5,442,213 | 8/1995 | Okudaira | 255/854 |
| 5,471,364 | 11/1995 | Summerfelt et al. | 361/321.4 |
| 5,504,041 | 4/1996 | Summerfelt | 437/235 |
| 5,654,222 | 8/1997 | Sandhu et al. | 438/3 |
| 5,663,088 | 9/1997 | Sandhu et al. | 438/396 |

OTHER PUBLICATIONS

Fazan, P.C., et al., "A High–C Capacitor (20.4fF/$\mu m^2$) with Ultrathin CVD–$Ta_2O_5$ Films Deposited on Rugged Poly–Si for High Density DRAMs", 1992 IEEE, pp. 263–266.

Lesaicherre, P–Y, et. al., "A Gbit–Scale DRAM Stacked Capacitor Technology with ECR MOCVD $SrTiO_3$ and RIE Patterned $RuO_2$/TiN Storage Nodes", 1994 IEEE, pp. 831–834.

Yamaguchi, H., et al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069–4073.

U.S. application No. 08/916,771, DeBoer et al.
U.S. application No. 08/994,054, Parekh et al.
U.S. application No. 08/670,644, Graettinger et al.

Eimori, T., et. al., "A Newly Designed Planar Stacked Capacitor Cell with High dielectric Constant Film for 256Mbit DRAM", 1993 IEEE, pp. 631–634.

M. Yoshimura, et al., "High Quality Ultra Thin $Si_3N_4$ Film Selectively Deposited On Poly–Si Electrode By LPCVD With In Situ HF Vapor Cleaning", IEDM 1992, pp. 271–274.

(List continued on next page.)

*Primary Examiner*—John F. Niebling
*Assistant Examiner*—Lynne A. Gurley
*Attorney, Agent, or Firm*—Well, St. John, Roberts Gregory & Matkin P.S.

[57] ABSTRACT

A semiconductor processing method of forming a capacitor on a substrate includes, a) providing an oxidizable and electrically conductive inner capacitor plate on the substrate; b) cleaning the inner capacitor plate to remove oxide therefrom; c) within a chemical vapor deposition reactor, chemical vapor depositing a dielectric nitride layer over the cleaned inner capacitor plate to a first thickness, the substrate not being exposed to oxidizing conditions between the cleaning and chemical vapor depositing steps; d) providing a densified $Ta_2O_5$ dielectric layer over the dielectric nitride layer; and e) providing an outer capacitor plate over the $Ta_2O_5$ layer. Additionally, a method of forming a capacitor on a substrate includes, i) providing an oxidizable and electrically conductive inner capacitor plate on a substrate; ii) providing a densified $Ta_2O_5$ dielectric layer over the inner capacitor plate; iii) within a chemical vapor deposition reactor, chemical vapor depositing a dielectric nitride layer over the $Ta_2O_5$ layer to a first thickness; and iv) providing an outer capacitor plate over the $Ta_2O_5$ layer, the outer capacitor plate being provided outwardly of the dielectric nitride layer. The invention also includes capacitors produced according to the method.

23 Claims, 3 Drawing Sheets

OTHER PUBLICATIONS

Kamiyama et al., "Highly Reliable 2.5nm $Ta_2O_5$ Capacitor Process Technology for 256Mbit DRAMs", IEMD 1991, pp. 827–830.

Kamiyama, et al., "Ultrathin Tantalum Oxide Capacitor Dielectric Layers Fabricated Using Rapid Thermal Nitridation Prior to Low Pressure Chemical Vapor Deposition", J. Electrochem. Soc., vol. 140, No. 6, Jun. 1993, pp. 1617–1625.

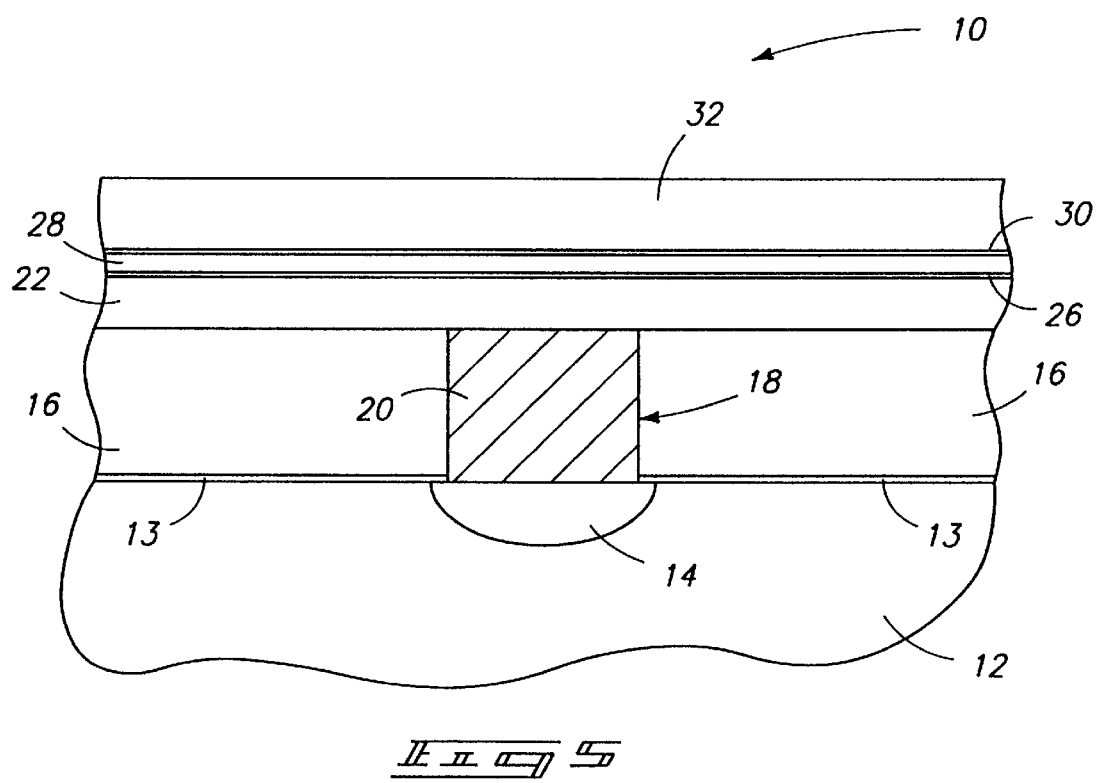

SEMICONDUCTOR PROCESSING METHOD OF FORMING A CAPACITOR AND CAPACITOR CONSTRUCTIONS

RELATED PATENT DATA

This patent resulted from a continuation application of U.S. patent application Ser. No. 08/542,430, filed Oct. 12, 1995, entitled "Semiconductor Processing Method of Forming a Capacitor and Capacitor Constructions", naming Klaus Schuegraf as inventor, and which is now U.S. Pat. No. 5,786,248 the disclosure of which is incorporated by reference.

TECHNICAL FIELD

This invention relates to semiconductor processing methods of forming capacitors having a $Ta_2O_5$ capacitor dielectric layer.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Chemical vapor deposited (CVD) $Ta_2O_5$ films are considered to be very promising cell dielectric layers for this purpose, as the dielectric constant of $Ta_2O_5$ is approximately three times that of conventional $Si_3N_4$ capacitor dielectric layers. However, one drawback associated with $Ta_2O_5$ dielectric layers is undesired leakage current characteristics. Accordingly, although $Ta_2O_5$ material has inherently higher dielectric properties, as-deposited $Ta_2O_5$ typically produces unacceptable results due to leakage current.

Densification of $Ta_2O_5$ as deposited has been reported to significantly improve the leakage characteristics of such layers to acceptable levels. Prior art densification of such layers includes exposing the $Ta_2O_5$ layer to extreme oxidizing conditions. Undesirably, however, such has a tendency to form an $SiO_2$ layer intermediate/between the polysilicon and $Ta_2O_5$. Further and regardless, a thin $SiO_2$ layer will also typically inherently form during the $Ta_2O_5$ deposition due to the presence of oxygen at the polysilicon layer interface. It would be desirable to remove or eliminate this $SiO_2$ layer intermediate the $Ta_2O_5$ and polysilicon layers, yet allow for such desired densification.

One prior art technique reported includes exposing the polysilicon layer to rapid thermal nitridation prior to subsequent deposition of the $Ta_2O_5$ layer. Such are reported by Kamiyama et al., "Ultrathin Tantalum Oxide Capacitor Dielectric Layers Fabricated Using Rapid Thermal Nitridation prior to Low Pressure Chemical Vapor Deposition", J. Electrochem. Soc., Vol. 140, No. 6, June 1993 and Kamiyama et al., "Highly Reliable 2.5 nm $Ta_2O_5$ Capacitor Process Technology for 256 Mbit DRAMs", 830-IEDM 91, pp. 32.2.1–32.2.4. Such rapid thermal nitridation includes exposing the subject polysilicon layer to temperatures of from 800° C. to 1100° C. for sixty seconds in an ammonia atmosphere at atmospheric pressure. The nitride layer acts as a barrier layer to oxidation during $Ta_2O_5$ deposition and subsequent high temperature densification processes to prevent oxidation of the underlying polysilicon electrode. These processes do however have several drawbacks, including the undesired high temperature cycling and formation of a fairly thick native $SiO_2$ on the nitride in series with the $Ta_2O_5$, all of which adversely effects the realization of high capacitance promised by inherent $Ta_2O_5$ layers.

It would be desirable to improve upon such prior art processes enabling utilization of $Ta_2O_5$ layers in capacitor constructions.

BRIEF DESCRIPTION OF THE DRAWINGS

Preferred embodiments of the invention are described below with reference to the following accompanying drawings.

FIG. 5 is a view of the FIG. 1 wafer at a processing step subsequent to that shown by FIG. 4.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a capacitor on a substrate comprises the following steps:

providing an oxidizable and electrically conductive inner capacitor plate on the substrate;

cleaning the inner capacitor plate to remove oxide therefrom;

within a chemical vapor deposition reactor, chemical vapor depositing a dielectric nitride layer over the cleaned inner capacitor plate to a first thickness, the substrate not being exposed to oxidizing conditions between the cleaning and chemical vapor depositing steps;

providing a densified $Ta_2O_5$ dielectric layer over the dielectric nitride layer; and providing an outer capacitor plate over the $Ta_2O_5$ layer.

In accordance with another aspect of the invention, a semiconductor processing method of forming a capacitor on a substrate comprises the following steps:

providing an oxidizable and electrically conductive inner capacitor plate on the substrate;

providing a densified $Ta_2O_5$ dielectric layer over the inner capacitor plate;

within a chemical vapor deposition reactor, chemical vapor depositing a dielectric nitride layer over the $Ta_2O_5$ layer to a first thickness; and providing an outer capacitor plate over the $Ta_2O_5$ layer, the outer capacitor plate being provided outwardly of the dielectric nitride layer.

In accordance with still a further aspect of the invention, a semiconductor processing method of forming a capacitor on a substrate comprises the following steps:

providing an oxidizable and electrically conductive inner capacitor plate on the substrate;

cleaning the inner capacitor plate to remove oxide therefrom;

within a chemical vapor deposition reactor, first chemical vapor depositing a first dielectric nitride layer over the cleaned inner capacitor plate to a first thickness, the substrate not being exposed to oxidizing conditions between the cleaning and first chemical vapor depositing steps;

providing a densified $Ta_2O_5$ dielectric layer over the dielectric nitride layer;

within a chemical vapor deposition reactor, second chemical vapor depositing a second dielectric nitride layer over the $Ta_2O_5$ layer to a second thickness; and providing an outer capacitor plate over the $Ta_2O_5$ layer, the outer capacitor plate being provided outwardly of the second dielectric nitride layer.

Figure 1:
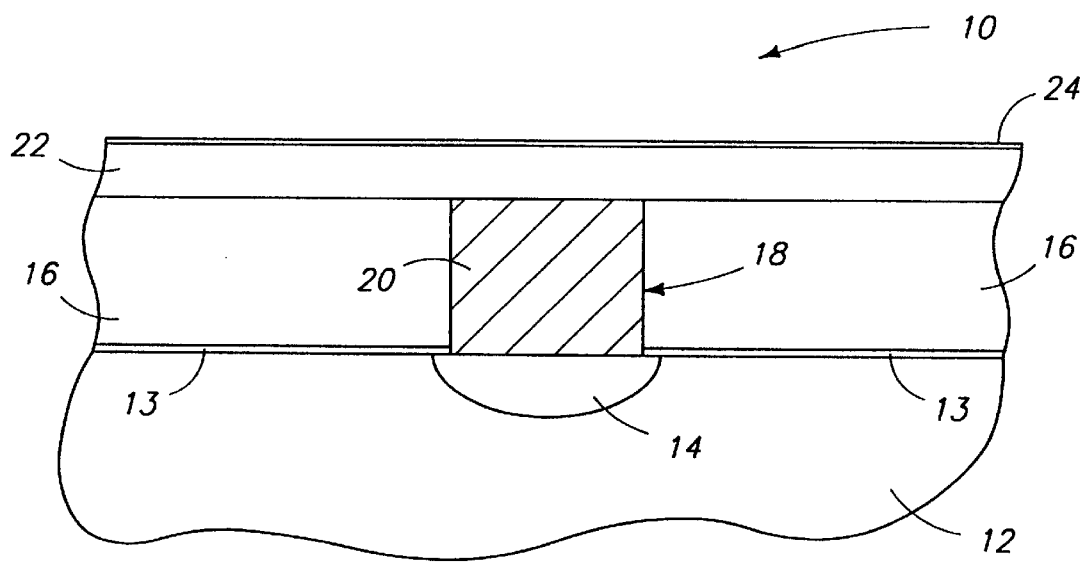
FIG. 1 is a diagrammatic fragmentary sectional view of a semiconductor wafer fragment at one processing step in accordance with the invention.

More particularly and first with reference to FIG. 1, a semiconductor wafer fragment in process is indicated generally with reference numeral 10. Such comprises a bulk silicon substrate 12 having a conductive diffusion layer 14 formed therein. An insulating layer 16, typically borophosphosilicate glass (BPSG), is provided over bulk substrate 12. Preferably, an intervening barrier layer 13 is provided intermediate layer 16 and substrate 12 to prevent boron and phosphorus diffusion from layer 16 into substrate 12. A contact opening 18 is provided to diffusion area 14. A conductive material 20 fills contact opening 18, with material 20 and oxide layer 16 having been planarized as shown. Material 20 might be any suitable conductive material, such as tungsten or conductively doped polysilicon. A capacitor construction will be provided atop layer 16 and plug 20, with conductive plug 20 constituting a node to which electrical connection to the capacitor will be made.

An oxidizable and electrically conductive inner capacitor plate layer 22 is provided relative to the illustrated substrate. Such preferable comprises conductively doped polysilicon having a conductivity doping of at least $5 \times 10^{19}$ ions/cm$^3$. For 256 Mb integration, a preferred thickness for layer 22 is from 300 Angstroms to 500 Angstroms. An undesired native silicon oxide layer 24 typically forms atop polysilicon layer 22 upon any exposure of the substrate to oxidizing conditions. Inner capacitor plate layer 22 is subsequently cleaned to remove oxide layer 24, or other potentially entrained contaminants, therefrom. The preferred method for such cleaning is within a chemical vapor deposition reactor utilizing HF vapor. Alternately by way of example, cleaning can occur ex situ of a chemical vapor deposition reactor with the wafer not being subject to temperature and oxygen ambient conditions which would result in reoxidation of layer 22.

Figure 2:
FIG. 2 is a view of the FIG. 1 wafer at a processing step subsequent to that shown by FIG. 1.

Referring to FIG. 2 after layer 24 removal, and within a chemical vapor deposition reactor, a first dielectric nitride layer 26 is first chemical vapor deposited over cleaned inner capacitor plate 22 to a desired first thickness. The illustrated substrate is not exposed to any oxidizing conditions between the previous cleaning and subsequent chemical vapor depositing steps. Ideally, the cleaning and chemical vapor depositing steps are conducted in the same reactor without removing the substrate from the reactor between the cleaning and chemical vapor depositing steps. Example conditions for depositing layer 26 include combination of dichlorosilane gas, a carrier gas and ammonia gas within the reactor, with the wafer temperature being maintained at from 600° C. to 800° C., with the reactor ambient being maintained at a pressure of from 100 mTorr–500 mTorr. Such will result in deposition of the preferred dielectric nitride material of $Si_3N_4$. Preferably, layer 24 is provided as thin as practical, at less than about 30 Angstroms. Ideally, the thickness of layer 24 will be provided at 20 Angstroms, with around 15 Angstroms believed to be most preferred.

Figure 3:
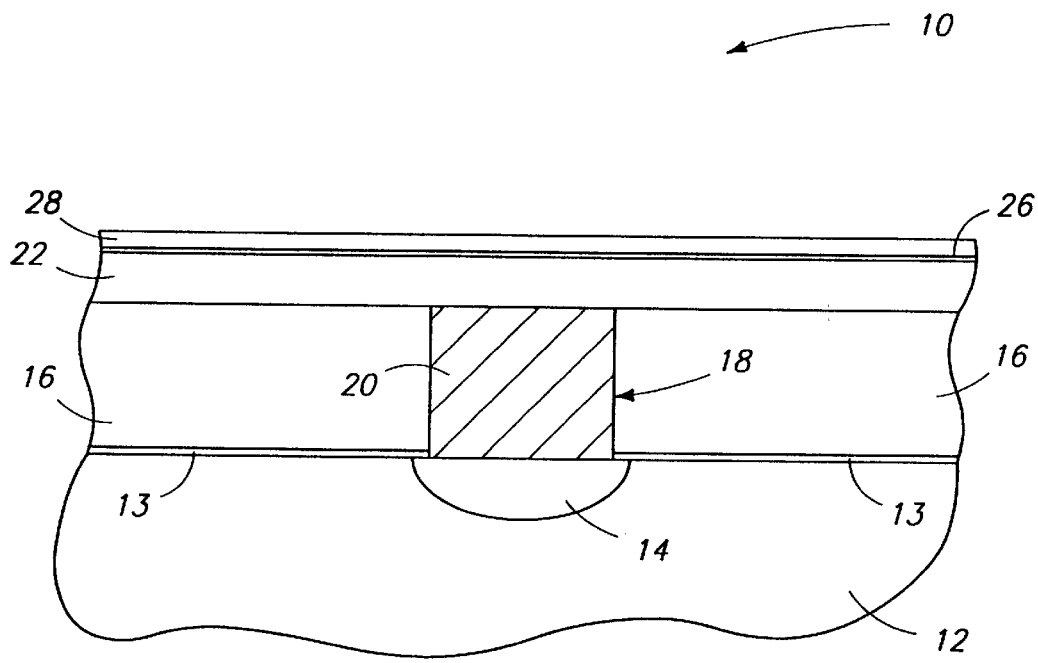
FIG. 3 is a view of the FIG. 1 wafer at a processing step subsequent to that shown by FIG. 2.

Referring to FIG. 3, a $Ta_2O_5$ capacitor dielectric layer 28 is chemical vapor deposited over dielectric nitride layer 26, and accordingly also over inner capacitor plate 22. An example process for depositing layer 28 is by low pressure chemical vapor deposition at 450° C. using $Ta(OC_2H_5)_5$ and oxygen as precursors. $Ta(OC_2H_5)_5$ can be vaporized at 170° C., and introduced into a chemical vapor deposition reactor chamber using argon or another suitable carrier gas. Subsequently, densification by rapid thermal annealing in a dry oxygen atmosphere at a temperature ranging from 700° C. to 900° C. is utilized. An example and preferred thickness for layer 28 in accordance with 256 Mb integration is 100 Angstroms. The annealing of the $Ta_2O_5$ layer densifies such layer, with first dielectric nitride layer 26 restricting oxidation of underlying oxidizable inner capacitor plate 22 during the annealing.

Accordingly, such provides a preferred method in accordance with the invention of providing a densified $Ta_2O_5$ dielectric layer over nitride layer 24 and inner capacitor plate 22. In this regard, the invention provides improvements over the prior art by minimizing the high temperature cycling which otherwise is required for the prior art rapid thermal nitridation to achieve an oxidation barrier layer intermediate the polysilicon and $Ta_2O_5$ layers. Further, provision of a nitride layer by chemical vapor deposition and in accordance with the invention obviates or at least minimizes any native oxide that might be formed intermediate nitride layer 26 in $Ta_2O_5$ layer 28 during the deposition. The prior art rapid thermal nitridation provides a considerably thicker and undesired layer of $SiO_2$ intermediate the $Ta_2O_5$ and polysilicon layers.

Figure 4:
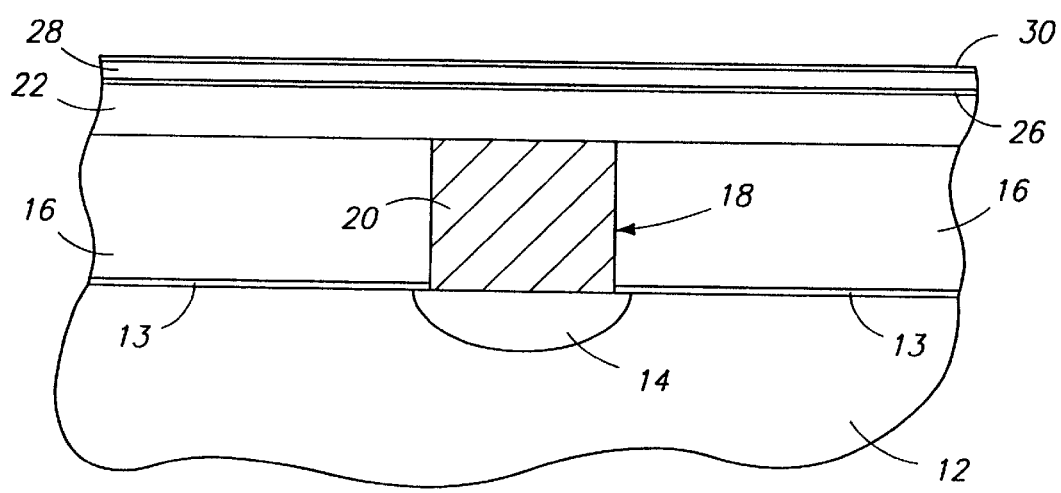
FIG. 4 is a view of the FIG. 1 wafer at a processing step subsequent to that shown by FIG. 3.

Referring to FIG. 4 and within a chemical deposition reactor, a second dielectric nitride layer 30 is second chemical vapor deposited over $Ta_2O_5$ layer 28 to a desired second thickness. Again preferably, second dielectric nitride layer 30 is provided in the same manner which the first dielectric nitride layer is provided, and to the same preferred thickness.

Referring to FIG. 5, an electrically conductive outer capacitor plate layer 32 is provided over second nitride layer 30, and thus over $Ta_2O_5$ layer 28. An example and preferred material is conductively doped polysilicon deposited to a thickness of 500 Angstroms for 256 Mb integration. The illustrated layers 32, 30, 28, 26 and 22 of FIG. 5 would subsequently be patterned, typically in a common masking step, to define a discrete capacitor construction. Providing nitride layer 30 by chemical vapor deposition provides an advantage over the prior art of preventing oxidation of electrode 32 during subsequent heat treatment inherent in the processing to produce a capacitor construction, similar to the advantage layer 26 provides by impeding oxidation of layer 22.

The invention contemplates alternate provision of nitride layers 26 and 30 by alternate means or elimination of one of such layers, with the invention only being limited by the accompanying claims appropriately interpreted in accordance with the doctrine of equivalents.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a capacitor comprising:

forming an inner capacitor plate over a substrate;

first chemical vapor depositing a dielectric nitride layer over the inner capacitor plate to a first thickness;

separately second chemical vapor depositing a $Ta_2O_5$ dielectric layer over the dielectric nitride layer;

densifying the $Ta_2O_5$ layer; and forming an outer capacitor plate over the $Ta_2O_5$ layer.

2. The semiconductor processing method of forming a capacitor of claim 1 wherein the first thickness is less than about 30 Angstroms.

3. The semiconductor processing method of forming a capacitor of claim 1 wherein the first thickness is less than about 20 Angstroms.

4. The semiconductor processing method of forming a capacitor of claim 1 wherein the dielectric nitride layer comprises $Si_3N_4$.

5. The semiconductor processing method of forming a capacitor of claim 1 further comprising cleaning the inner capacitor plate to remove oxide therefrom prior to the first chemical vapor depositing.

6. A semiconductor processing method of forming a capacitor comprising:

forming an inner capacitor plate over a substrate;

chemical vapor depositing a silicon nitride layer over the inner capacitor plate to a first thickness;

after the chemical vapor depositing of the silicon nitride layer, forming a densified $Ta_2O_5$ dielectric layer having a second thickness over the silicon nitride layer; and forming an outer capacitor plate over the $Ta_2O_5$ layer.

7. The semiconductor processing method of forming a capacitor of claim 6 wherein the first thickness is less than about 30 Angstroms.

8. The semiconductor processing method of forming a capacitor of claim 6 wherein the first thickness is less than about 20 Angstroms.

9. The semiconductor processing method of forming a capacitor of claim 6 further comprising cleaning the inner capacitor plate to remove oxide therefrom prior to the chemical vapor depositing of the silicon nitride layer.

10. A semiconductor processing method of forming a capacitor comprising:

it forming an inner capacitor plate over a substrate;

chemical vapor depositing a first dielectric nitride layer over the inner capacitor plate;

forming a densified $Ta_2O_5$ dielectric layer over the first dielectric nitride layer;

chemical vapor depositing a second dielectric nitride layer over the $Ta_2O_5$ layer to a first thickness; and forming an outer capacitor plate over the $Ta_2O_5$ layer and outwardly of the second dielectric nitride layer.

11. The semiconductor processing method of forming a capacitor of claim 10 wherein the first thickness is less than about 30 Angstroms.

12. The semiconductor processing method of forming a capacitor of claim 10 wherein the first thickness is less than about 20 Angstroms.

13. The semiconductor processing method of forming a capacitor of claim 10 wherein the dielectric nitride comprises $Si_3N_4$.

14. A semiconductor processing method of forming a capacitor comprising:

forming an inner capacitor plate over a substrate;

first chemical vapor depositing a first dielectric nitride layer over the inner capacitor plate to a first thickness;

forming a separate densified $Ta_2O_5$ dielectric layer over the first dielectric nitride layer;

second chemical vapor depositing a second dielectric nitride layer over the $Ta_2O_5$ layer to a second thickness; and forming an outer capacitor plate over the $Ta_2O_5$ layer and outwardly of the second dielectric nitride layer.

15. The semiconductor processing method of forming a capacitor of claim 14 wherein the first and second thicknesses are less than about 30 Angstroms.

16. The semiconductor processing method of forming a capacitor of claim 14 wherein the first and second thicknesses are less than about 20 Angstroms.

17. The semiconductor processing method of forming a capacitor of claim 14 wherein the first and second dielectric nitride layers comprise $Si_3N_4$.

18. The semiconductor processing method of forming a capacitor of claim 14 further comprising cleaning the inner capacitor plate to remove oxide therefrom prior to the first chemical vapor depositing.

19. A semiconductor processing method of forming a capacitor comprising:

forming an inner capacitor plate over a substrate;

first chemical vapor depositing a first dielectric nitride layer over the inner capacitor plate to a first thickness;

forming a separate $Ta_2O_5$ dielectric layer over the first dielectric nitride layer;

densifying the $Ta_2O_5$ layer;

second chemical vapor depositing a second dielectric nitride layer over the $Ta_2O_5$ layer to a second thickness; and forming an outer capacitor plate over the $Ta_2O_5$ layer.

20. The semiconductor processing method of forming a capacitor of claim 19 wherein the first and second thicknesses are less than about 30 Angstroms.

21. The semiconductor processing method of forming a capacitor of claim 19 wherein the first and second thicknesses are less than about 20 Angstroms.

22. The semiconductor processing method of forming a capacitor of claim 19 wherein the first and second dielectric nitride layers comprise $Si_3N_4$.

23. The semiconductor processing method of forming a capacitor of claim 19 further comprising cleaning the inner capacitor plate to remove oxide therefrom prior to the first chemical vapor depositing.

* * * * *

UNITED STATES PATENT AND TRADEMARK OFFICE
CERTIFICATE OF CORRECTION

PATENT NO : 6,071,771
DATED : June 6, 2000
INVENTOR(S) : Klaus Schuegraf

It is certified that error appears in the above-identified patent and that said Letters Patent are hereby corrected as shown below:

Column 5, Line 62 Delete "it"

Signed and Sealed this

Twenty-second Day of May, 2001

Attest:

NICHOLAS P. GODICI

Attesting Officer     Acting Director of the United States Patent and Trademark Office